United States Patent
Iino et al.

(10) Patent No.: US 7,215,062 B1
(45) Date of Patent: May 8, 2007

(54) ULTRASONIC MOTOR AND ELECTRONIC APPLIANCE WITH ULTRASONIC MOTOR

(75) Inventors: Akihiro Iino; Masao Kasuga; Makoto Suzuki, all of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/369,090

(22) Filed: Aug. 5, 1999

(30) Foreign Application Priority Data

Aug. 7, 1998 (JP) ............................................ 10-224798

(51) Int. Cl.
*H01L 41/08* (2006.01)

(52) U.S. Cl. .............................. 310/323.02; 310/323.05
(58) Field of Classification Search ............ 310/323.05, 310/323.12, 323.16, 328, 346, 348

See application file for complete search history.

(56) References Cited

U.S. PATENT DOCUMENTS

| | | | | |
|---|---|---|---|---|
| 4,019,073 A | * | 4/1977 | Vishnevsky et al. ... | 310/323.02 |
| 4,513,219 A | * | 4/1985 | Katsuma et al. .... | 310/316.02 X |
| 4,649,311 A | | 3/1987 | Mukohjima et al. ........ | 310/323 |
| 4,771,203 A | * | 9/1988 | Mukohjima et al. ... | 310/323.05 |
| 4,868,446 A | * | 9/1989 | Kumada ................. | 310/323.02 |
| 4,959,580 A | * | 9/1990 | Vishnevsky et al. ... | 310/323.02 |
| 5,088,326 A | * | 2/1992 | Wada et al. ............ | 310/329 X |
| 5,099,166 A | * | 3/1992 | Hirano et al. .......... | 310/323.05 |
| 5,130,599 A | * | 7/1992 | Toda ..................... | 310/323.02 |
| 5,247,220 A | * | 9/1993 | Miyazawa et al. ..... | 310/316.02 |
| 5,451,827 A | * | 9/1995 | Takagi .................... | 310/323.05 |
| 5,661,360 A | * | 8/1997 | Takagi et al. ........... | 310/323.05 |
| 5,949,179 A | * | 9/1999 | Kumasaka et al. ..... | 310/359 X |
| 5,998,909 A | * | 12/1999 | Kumasaka et al. ..... | 310/359 X |
| 6,218,767 B1 | | 4/2001 | Akada et al. .......... | 310/323.02 |

FOREIGN PATENT DOCUMENTS

| | | |
|---|---|---|
| JP | 07-067366 | 3/1995 |
| JP | 09-201080 | 7/1997 |

* cited by examiner

*Primary Examiner*—Mark Budd
(74) *Attorney, Agent, or Firm*—Adams & Wilks

(57) ABSTRACT

An ultrasonic motor constructed so as to have improved driving force, reduced vibrational loss and smaller dimensions as compared with the conventional art. A piezoelectric vibrator generates a vibrational driving force in response to a received drive signal. A drive signal generator generates the drive signal. The drive signal is transmitted along leads to support members. The support members support, and are in electrical connection with, the piezoelectric vibrator on the substrate. Thus, the support member is effective for both supporting the piezoelectric member and for transmitting the drive signal from the drive signal generator to the piezoelectric vibrator. A moving member is in communication with the piezoelectric vibrator and moves in response to the vibrational driving force. The support member may be comprised of an elastic material so that it is effective for urging the piezoelectric vibrator against the moving member. This increases the frictional relationship between the moving member and the vibrational driving force, thereby increasing the output driving force. The support member may include a relatively thinner constriction portion and a relatively thicker connection portion, the constriction portion being effective for decreasing vibration losses. The support member may also be incorporated as part of the substrate, wherein the substrate includes a recess portion effective for receiving the piezoelectric vibrator to reduce thickness. To further reduce the overall dimensions of the inventive ultrasonic motor, the electrically conductive support member may be part of a drive circuit for generating the drive signal. Also, the support member may be configured for supporting the piezoelectric vibrator at a flex vibration node of the piezoelectric vibrator to reduce vibrational loss.

15 Claims, 6 Drawing Sheets

US 7,215,062 B1

ULTRASONIC MOTOR AND ELECTRONIC APPLIANCE WITH ULTRASONIC MOTOR

BACKGROUND OF THE INVENTION

1. Field of the Invention

The present invention pertains to ultrasonic motors used for timepieces, cameras, printers, memory devices and so on. More particularly, the present invention pertains to an ultrasonic motor with reduced vibration inefficiency to more efficiently transmit a drive force to a moving member;

2. Description of the Related Art

A conventional ultrasonic motor utilizes, as power to move a moving member, elliptic vibration that is a resultant vibration of expansion-and-contraction vibration and flex vibration caused on a piezoelectric element applied by a drive signal such as an alternating current voltage. Recently, attention has been drawn to ultrasonic motors particularly in the field of micro-mechanics, because of their high electric-to-mechanical energy conversion efficiency.

A conventional ultrasonic motor generally has a piezoelectric element as a drive power source, a signal transmission means for transmitting drive signals to the piezoelectric element, and an elastic member for pressure-contacting the piezoelectric element with the moving member to efficiently transmit drive power to the moving member.

Where such a ultrasonic motor is installed on a circuit board, such as a printed circuit board, it is held on the circuit board by a support member that holds the piezoelectric element of the ultrasonic motor.

However, it is necessary for the conventional ultrasonic motor to provide the piezoelectric element with a signal transmission part, such as conductor wires, to apply a drive signal to the piezoelectric element. Loss occurs of the expansion-and-contraction vibration and flex vibration through both the support member and the signal transmission part. In addition loss of the expansion-and-contraction vibration and flex vibration also occurs through the elastic member.

As a result, a conventional ultrasonic motor does not efficiently transmit drive force to the moving member, thus impairing the electric-to-mechanical energy conversion.

Further, mounting a plurality of elements on the piezoelectric element prevents size reduction for the ultrasonic motor and decreases the reliability of the motor.

Accordingly, it is an object of the present invention to provide an ultrasonic motor with reduced loss of the drive force produced on a piezoelectric element so as to efficiently transmit the drive force to a moving member, and wherein size reduction and improvement in reliability are achieved.

SUMMARY OF THE INVENTION

In accordance with the present invention, an ultrasonic motor is provided that includes a piezoelectric vibrator for oscillating in response to an input drive signal. The oscillating piezoelectric vibrator generates a drive force. A support member supports the piezoelectric vibrator on a substrate. The support member also transmit the drive signal to the piezoelectric vibrator.

The support member is formed, for example, of a resin having on its surface a signal line or it is formed of a metal so as to have a signal transmission function.

The piezoelectric vibrator is formed, for example, only by a piezoelectric element. Alternatively, the piezoelectric vibrator may be formed as a metal vibrator bonded to a piezoelectric element. The drive control may be either of a self-oscillation type or a separately-oscillation type.

According to this invention, because the drive signal is transmitted through the support member to the piezoelectric vibrator, there is no need to separately providing a signal transmission part.

Accordingly, loss of the expansion-and-contraction vibration and flex vibration caused on the piezoelectric vibrator is reduced as compared to the conventional ultrasonic motor.

Therefore, the ultrasonic motor according to the invention efficiently transmits a drive force caused on the piezoelectric vibrator to the moving member.

Also, in accordance with the present invention, there is no need for separately providing a signal transmission part size of the ultrasonic motor and further the number of manufacture processes resulting in reduction in the cost to manufacture the invention ultrasonic motor.

Also, in accordance with the present inventive ultrasonic motor, the support member is elastic and the piezoelectric vibrator is press-contacted with the moving member by the elastic force of the support member.

The elastic support member is comprised of an elastic material, for example, a conductive rubber or the like.

In addition, the piezoelectric vibrator is urged toward the moving member by the elasticity of the support member. Accordingly, the drive force caused on the piezoelectric vibrator is transmitted to the moving member with higher efficiency.

Also in accordance with the inventive ultrasonic motor, the support member has a constriction portion that is thinner than a connection portion connected to the piezoelectric vibrator.

Accordingly, the constriction portion of the support member reduces the vibration transmission area of the support member so as to reduce the loss of vibration. Consequently, the ultrasonic motor transmits a drive force to the moving member with higher efficiency. Furthermore, the support member deforms due to the constriction portion.

Furthermore, in accordance with the present invention the support member is a part of the substrate.

Thus, because the support member is a part of the substrate, the ultrasonic motor is easy to mount on the substrate.

Furthermore, in accordance with the present invention, the piezoelectric vibrator is provided in a recess formed in the substrate.

In accordance with this aspect of the invention, the piezoelectric vibrator is mounted such that the surface of the substrate and the surface of the piezoelectric vibrator are positioned in a same plane, through the support member formed as a part of the substrate.

In addition, the thickness of the inventive ultrasonic motor is decreased.

Furthermore, the present invention is characterized in that, in the aforesaid ultrasonic motor, the piezoelectric vibrator is mounted on the support member.

According to this aspect of the invention, because the piezoelectric vibrator is mounted on the support member, the piezoelectric vibrator can be mounted on a substrate in a similar manners as the conventional mounting of transistors or capacitors on a substrate. That is, in accordance with the ultrasonic motor of the present invention, it is possible to simultaneously mount a motor and circuits on a substrate by using an existing electric circuit production line. Accordingly, the ultrasonic motor is less expensive and more stable. Consequently, the inventive ultrasonic motor has better performance characteristics with improved reliability.

Further, in accordance with the present invention the support member is provided with at least one part of a drive circuit.

According to this aspect of the invention, because the support member is provided with at least part of a drive circuit, the number of drive circuit elements required to be mounted on a substrate are decreased, thereby reducing the size of the ultrasonic motor. Also, there is reduction of variation in ultrasonic motor performance resulting from a connection between the piezoelectric vibrator and the drive circuit. Further, circuit parts can be mounted and adjusted so as to adjust the variation in the motor and circuits, thus improving the reliability.

Further, in accordance with the present invention, the support member supports the piezoelectric vibrator at a point corresponding to a node of vibration caused thereon.

Here, the vibration includes, for example, flex vibration and expansion-and-contraction vibration.

According to this aspect of the invention, the support member holds the piezoelectric vibrator at a point corresponding to a node of flex vibration. Because there is no displacement in the node of vibration, there is further a decrease in the amount of vibration loss caused on the piezoelectric vibrator. Consequently, the ultrasonic motor can transmit a drive force caused on the piezoelectric vibrator to the moving member with higher efficiency.

Furthermore, in accordance with the present invention, the ultrasonic motor is an electronic appliance having the aforesaid ultrasonic motor.

According to this aspect of the invention, because the aforesaid ultrasonic motor is used in which less vibration is lost to the outside as compared to the conventional ultrasonic motor, the ultrasonic motor has increased output efficiency. That is, because the ultrasonic motor and its drive circuit are reduced in size, the electronic appliance with ultrasonic motor is decreased in size.

DETAILED DESCRIPTION OF THE INVENTION

Embodiments of the present invention will be explained in detail with reference to FIG. 1 to FIG. 7.

Figure 1:
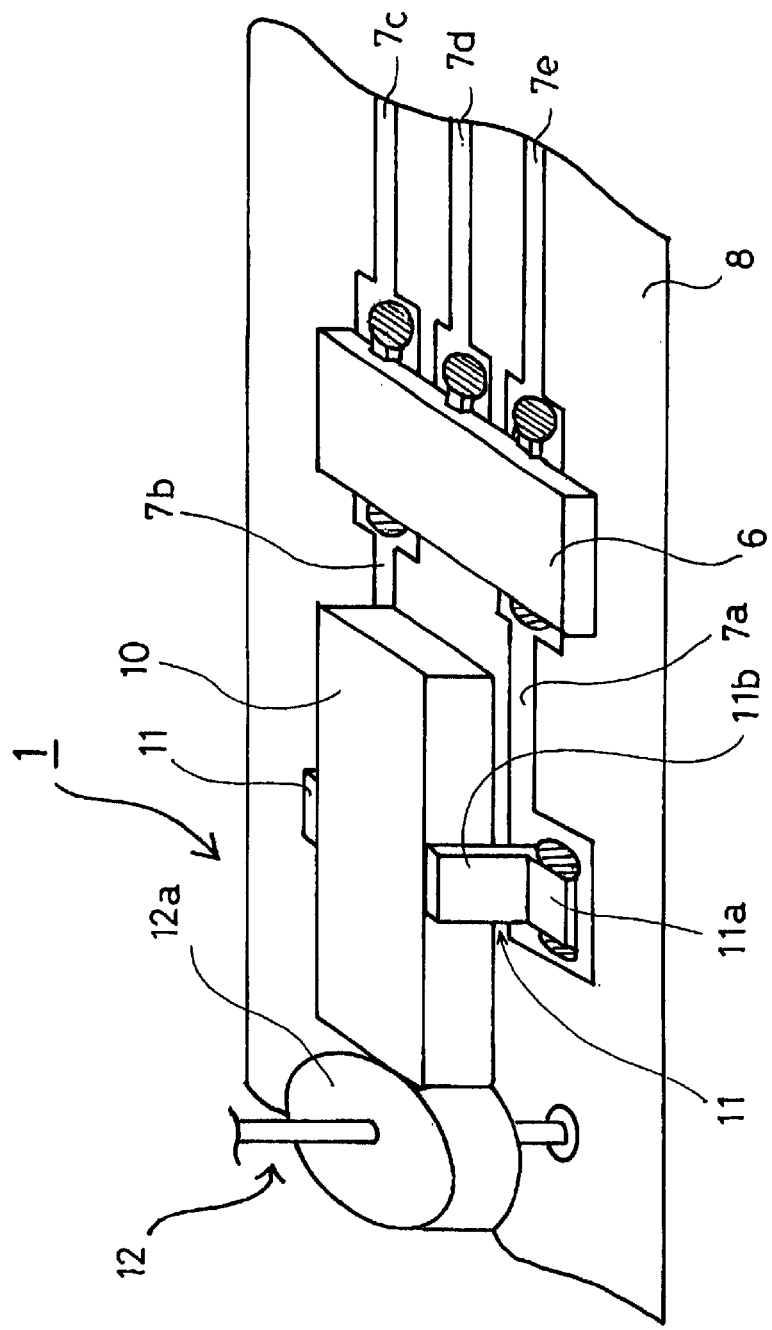
FIG. 1 is a view showing a structure of an ultrasonic motor according to a first embodiment of the present invention.
Figure 2A:
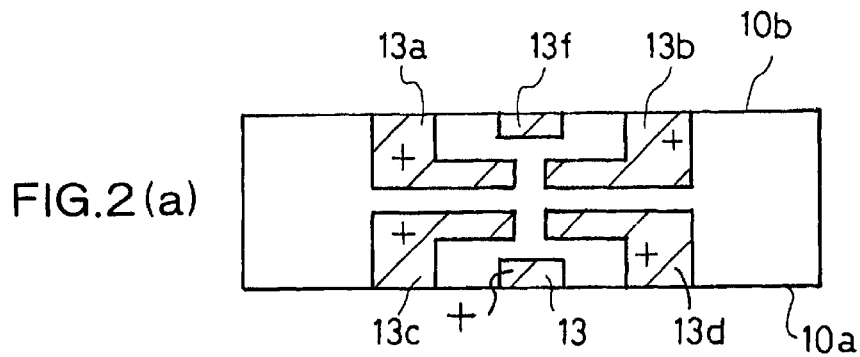
FIG. 2 is a view showing a structure of a piezoelectric vibrator and piezoelectric vibrator with electrodes used in a piezoelectric element for the inventive ultrasonic motor.
Figure 2B:
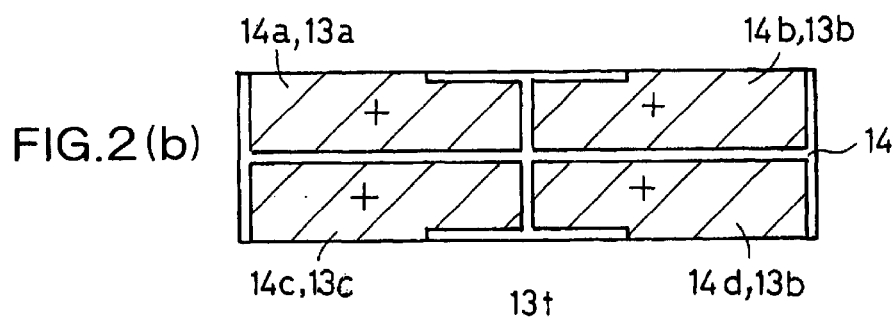
Figure 2C:
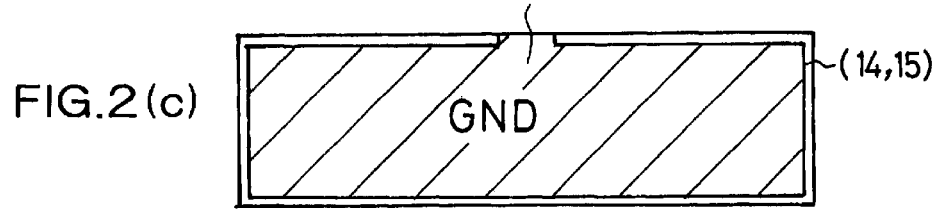
Figure 2D:
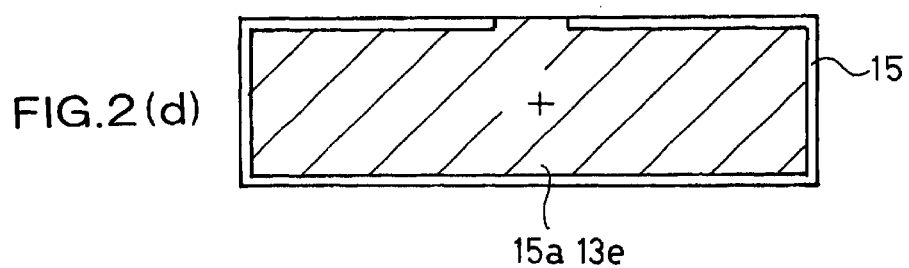
Figure 2E:
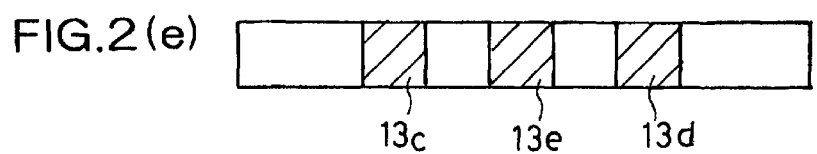
Figure 2F:
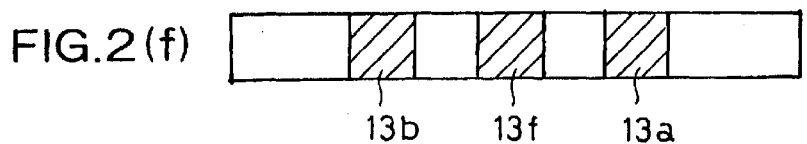
Figure 3:
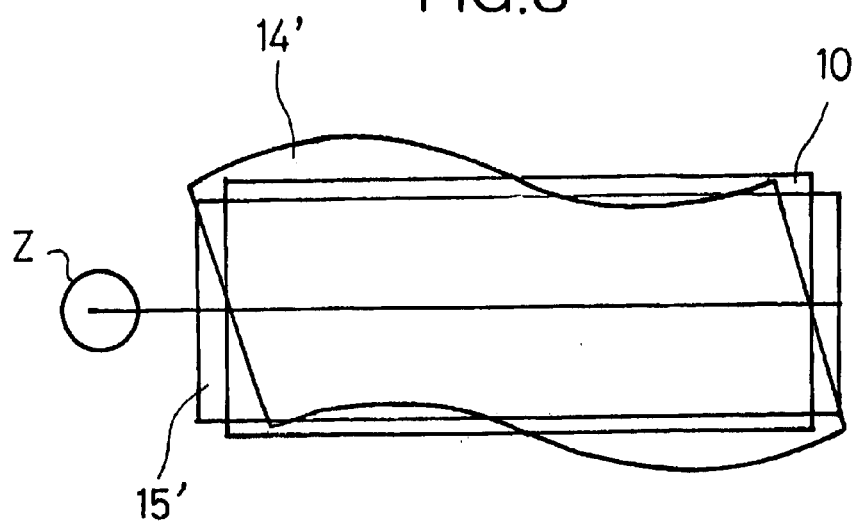
FIG. 3 is a schematic view showing the operation of the ultrasonic motor.
Figure 4:
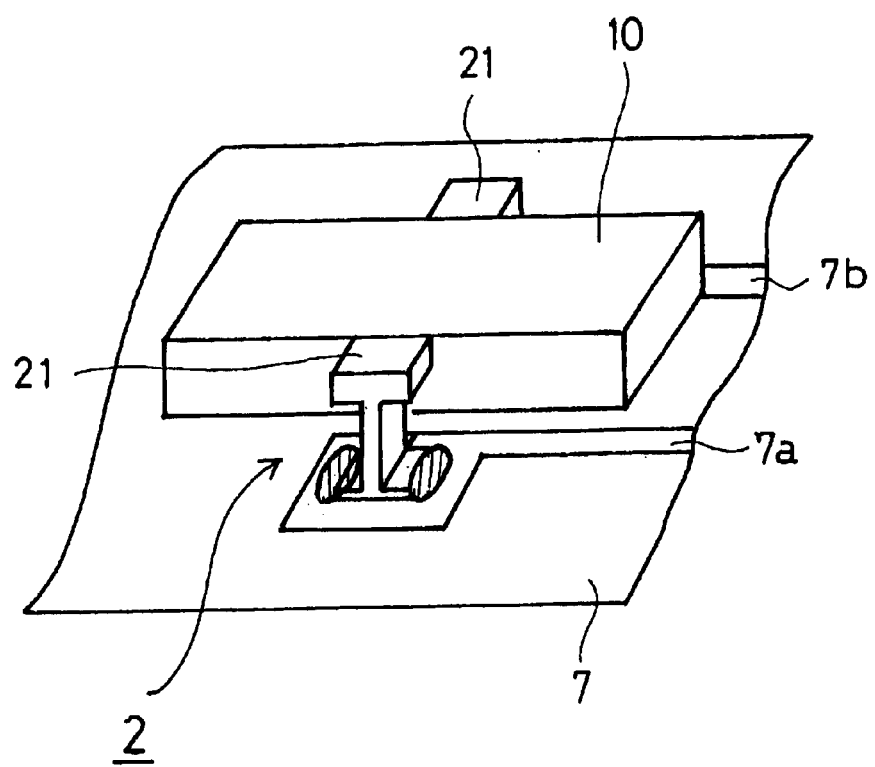
FIG. 4 is a view showing structural essentially elements of a modification to the inventive ultrasonic motor.

FIG. 1 to FIG. 3 are figures for explaining an ultrasonic motor 1 as a first embodiment of the invention, while FIG. 4 is a figure showing a structure of a ultrasonic motor 2 configured as a modification of the ultrasonic motor 1.

FIG. 5 is a figure for explaining a second embodiment of the inventive ultrasonic motor 3, while FIG. 6 is a figure for explaining an ultrasonic motor 4 configured as a modification of the ultrasonic motor 3.

Figure 7:
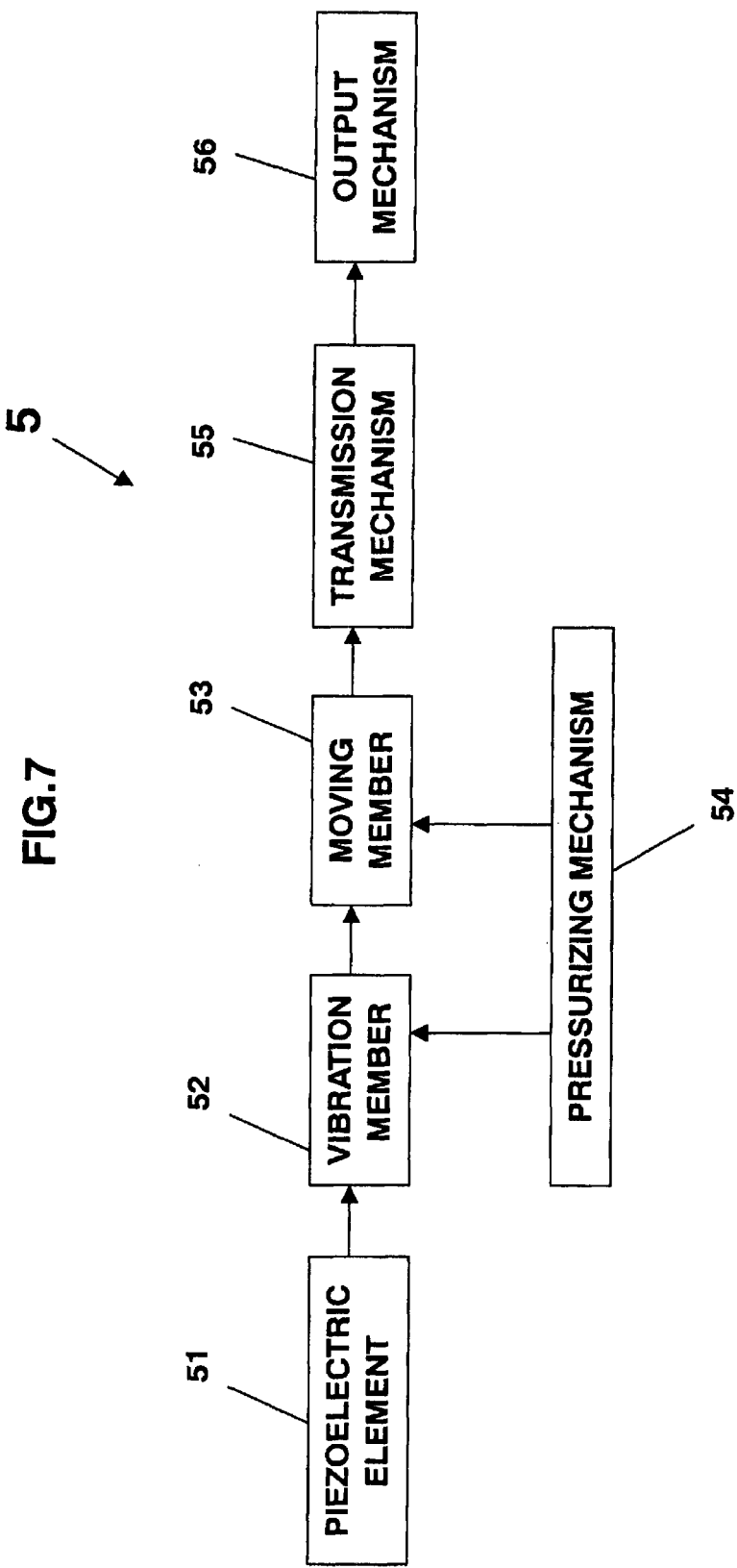
FIG. 7 is a view showing a structure of an electronic appliance constructed with an ultrasonic motor according to a third embodiment of the present invention.

FIG. 7 is a figure for explaining an electronic appliance 5 with a ultrasonic motor as a third embodiment of the invention.

FIG. 1 is a view showing the overall structure of the ultrasonic motor 1.

As shown in FIG. 1 the ultrasonic motor 1 includes a piezoelectric element 10 (piezoelectric vibrator) that receives a drive signal X, such as a sine wave, to elliptically vibrate, support members 11, 11. Support members 11 hold the piezoelectric elements 10 on a substrate 7 and deliver signals. through signal lines 7a, 7b on the substrate 7. A symmetry member 12 has a moving member 12a contacted with an end face of the piezoelectric element 10. A drive IC 6 is provided on the substrate 7 to input drive signal X to the piezoelectric element 10 through the signal lines 7a, 7b and the support members 11, 11. Incidentally, the drive IC 6 outputs drive signal X to a predetermined portion of an electrode of the piezoelectric element 10, according to a forward drive command, backward drive command and stop command externally input through signal lines 7c, 7d and 7e.

In accordance with the present invention, the ultrasonic motor 1 causes elliptic vibration at the piezoelectric member 10 end face according to drive signal X given from the drive IC 6 thereby moving the moving member 12a in directions parallel to the end face.

The support members 11 are formed of a resin, for example, generally in a L-form and each having, for example, three signal lines on a surface. That is, the support members 11, 11 have, for example, 6 signal lines which is the same as the number of electrodes provided on the side faces of the piezoelectric element 10.

The support member 11 has one side 11a fixed to the signal line 7a of the substrate 7, for example, through solder. Also, the support member 11 has the other side 11b fixed on a side face of the piezoelectric element 10, for example, through conductive adhesive in a manner for holding a node of flexional vibration.

Signal lines 7a, 7b are a bundle of three signal lines. This number of signal lines is the same as the number of electrodes provided on the piezoelectric element 10 one side face, hereinafter referred to, which signal lines are separately connected respectively to signal lines of the support member 11.

The support member 11 supports the piezoelectric element 10 on the substrate 7 and connects between the electrodes of the piezoelectric element 10 and the signal line 7a or signal line 7b.

In this manner, the support member 11 formed with the signal line also serves as a signal transmission means to transmit a signal to the piezoelectric element 10. Thus, the number of parts connected to the piezoelectric member 10 is reduced and the ultrasonic motor 1 is made smaller in size.

Next, the piezoelectric element 10 will be explained in detail.

The piezoelectric element 10 has a piezoelectric vibrator 14 provided as a flex vibration source laminated thereon with a piezoelectric vibrator 15 as an expansion-and-contraction vibration source in one body, and is structured having an electrode 13a, electrode 13b, electrode 13c, electrode 13d, electrode 13e and electrode 13f.

These electrodes 13a to 13f are respectively connected to the 6 signal lines provided on the support members 11, 11, and voltages are to be individually applied thereto.

Incidentally, a projection may be formed approximately in the center of the piezoelectric element 10 to contact with and drive the moving member 12a.

The piezoelectric vibrator 14, 15 and the electrodes 13a to 13f will be explained in detail, with reference to FIG. 2.

FIG. 2(a) is a view showing an arrangement of electrodes on one face of the piezoelectric element 10. FIG. 2(e) is a view showing an arrangement of electrodes in the side face 10a (see (a) of the figure), while (f) of the figure is a view showing an arrangement of electrodes in the side face 10b (see (a) of the figure).

FIG. 2(b) is a view showing one surface of the piezoelectric vibrator 14, while (d) of the figure shows the other surface of the piezoelectric vibrator 15. FIG. 2(c) is a top view of the piezoelectric vibrator 15.

A polarization structure of each piezoelectric vibrator will next be explained.

The piezoelectric vibrator 14 is structured, as shown in FIG. 2(b), divided into two in a vertical direction and also divided into two in a horizontal direction, i.e. a polarization region 14a, a polarization region 14b, a polarization region 14c and a polarization region 14d that are to be polarized + at their top surfaces in a laminated direction.

Meanwhile, the piezoelectric vibrator 15 is structured, as shown in FIG. 2(d), having one polarization region almost on an entire surface so that it can be polarized +, for example, on an underside surface in the lamination direction.

Next the structure of the electrodes 13a to 13f will be explained.

The electrode 13a substantially covers a top surface of the polarization region 14a of the piezoelectric vibrator 14, one part of which is extended to a side face 10b. That is, all the polarization regions 14a, 14a . . . of a plurality of piezoelectric vibrators 14, 14 . . . , at the top surfaces, are brought to a same potential by the electrode 13a continuing through extended portions to the side face 10b.

Similarly, the electrode 13b substantially covers over one surface of the polarization region 14b of the piezoelectric vibrator 14, one part of which is extended to a side face 10b. That is, all the polarization regions 14b, 14b . . . of the plurality of piezoelectric vibrators 14, 14 . . . , at the one surfaces, are to become are brought to a same potential by the electrode 13b continuing through extended portions to the side face 10b.

Meanwhile, the electrode 13c substantially covers over a surface of the polarization region 14c of the piezoelectric vibrator 14, one part of which is extended to a side face 10b. That is, all the polarization regions 14c, 14c . . . of the plurality of piezoelectric vibrators 14, 14 . . . , at the one surfaces, are brought to a same potential by the electrode 13c continuing through extended portions to the side face 10a.

Similarly, the electrode 13d substantially covers over one surface of the polarization region 14d of the piezoelectric element 14, one part of which is extended to a side face 10b. That is, all the polarization regions 14d, 14d . . . of the plurality of piezoelectric vibrators 14, 14 . . . , at the one surfaces, are brought to a same potential by the electrode 13d continuing through extended portions to the side face 10a.

Also, the electrode 13e substantially covers over the other surface of the polarization region is a of the piezoelectric vibrator 15, one part of which is extended to a side face 10a. That is, all the polarization regions 15a, 15a . . . of a plurality of piezoelectric vibrators 15, 15 . . . , at the other surfaces, are brought to a same potential by the electrode 13e continuing through extended portions to the side face 10a.

Further, the electrode 13f is sandwiched between the other surface of the piezoelectric vibrator 14 and the one surface of the piezoelectric vibrator 15. Consequently, the electrode 13f covers over all the undersides of the four polarization regions 14a, 14b, 14c and 14d of the piezoelectric vibrator 14, and at the same time over the entire top surface of the polarization region 15a of the piezoelectric vibrator 15, part of which is extended to the side face 10b. That is, all the polarization regions 14d, 14d . . . of the plurality of piezoelectric vibrators 14, 14, at the top surfaces, are brought to a same potential by the electrode 13f continuing through the extended portions to the side face 10b.

Incidentally, the number of the piezoelectric vibrators 14, 15 may be increased appropriately. In this case, the electrode structure is changed depending on a lamination method.

Now, the operation of the ultrasonic motor 1 is explained using FIG. 3.

If the drive IC 6 is externally input by a drive command signal in a positive direction through the signal line 7c shown in FIG. 1, it outputs a drive signal X to the electrodes 13a, 13d, 13e and 13f of the piezoelectric element 10 through the signal lines 7a, 7b and the aforesaid signal lines on the support member 11.

Thereupon, in the piezoelectric vibrator 15 the drive signal X is input to the electrode 13e with respect to the electrode 13f as a reference electrode. Accordingly, the polarization region is a expands or contracts. Consequently, the piezoelectric vibrator 15 expands or contracts in a lengthwise direction as shown by rectangle 15' in FIG. 3.

Simultaneously, in the piezoelectric vibrator 14 the drive signal X is input to the electrodes 13a, 13d with respect to the electrode 13f as a reference electrode. Accordingly, the polarization regions 14a, 14d expands. Consequently, the piezoelectric vibrator 14 effects flexional vibration as shown by rectangle 14' in FIG. 3.

At this time, the only members connected to the piezoelectric element 10 are the support members 11, 11. Because no signal transmission means is separately provided, vibration loss is reduced from the piezoelectric element 10.

As a result, the expanding-and-contracting vibration on the piezoelectric vibrator 15 and the flexional vibration on the piezoelectric vibrator 14 are combined so that the piezoelectric element 10 at the end face effects elliptic vibration in a Z direction in FIG. 3, thereby moving the moving member 12a shown in FIG. 1 in the Z direction as a positive direction.

Also, if the drive IC 6 is externally input by a drive command in a reverse direction through the signal line 7d, it outputs a drive signal X to the electrodes 13b, 13c, 13e and 13f of the piezoelectric element 10 through the signal lines 7a, 7b and the aforesaid signal lines on the support member 11. Thereupon, because the electrodes 13b, 13c are input by the drive signal X, the flex vibration of the piezoelectric vibrator 14 with respect to the expanding-and-contracting vibration as a reference of the piezoelectric vibrator 15 is reversed in direction from the positive direction case as stated above. Accordingly, the piezoelectric element 10 at the end face effects elliptic vibration in a direction reverse to Z in FIG. 3, thereby moving the moving member 12a shown in FIG. 1 in a reverse direction.

As described above, according to a first embodiment of the inventive ultrasonic motor 1, because the drive signal X is delivered to the piezoelectric element 10 through the signal line 7a by the support member 11, there is no necessity of separately providing a signal transmission part. Accordingly, the loss of the expanding-and-contracting vibration and flex vibration caused on the piezoelectric element 10 is reduced, as compared to the conventional ultrasonic motor. Also, because the support members 11 are fixed in a manner holding a flex vibration node, the loss of the flex vibration caused on the piezoelectric element 10 is further reduced.

Further, because there is no necessity of separately providing a signal transmission part, the ultrasonic motor 1 is reduced in size, along with the number of manufacture processes, thereby reducing manufacturing costs.

Accordingly, the ultrasonic motor 1 effectively transmits a drive force generate on the piezoelectric element 10 to the moving member 12a.

Incidentally, in this embodiment of the present invention, although the support member 11 was made of a resin, the present invention is not limited to this and may be of a metal, for example. In this case, the number of support members 11 has to be provided corresponding to the number of electrodes.

Further, the support member 11 may be provided with an entire or one part of an electric circuit, e.g. self-oscillation transmitting circuit. In this case, the number of elements to be provided on the substrate decreases, and the required substrate area decreases. Accordingly, the ultrasonic motor 1 is further reduced in size.

The present embodiment may be modified as below.

FIG. 4 is a view showing a structure of elements of a ultrasonic motor 2 of a first modification to the present embodiment.

The ultrasonic motor 2 is made by a structure, in the ultrasonic motor 1, using support members 21 in place of the support members 11.

The support members 21 are formed with a constriction in a generally I-form in the support member 11 with other parts structured similar to those of the support member 11. Thus, the support members 21 possess elasticity. Also, the support members 21 are fixed at side faces of the piezoelectric element 10 so that they can deflect in a direction parallel to the side face of the piezoelectric element 10.

Accordingly, the support members 21 presses the piezoelectric element 10 against the moving member 12a (not shown in FIG. 4).

That is, the ultrasonic motor 2 has an equivalent function as the ultrasonic motor 1. Further, because the piezoelectric element 10 is put in pressure contact with the moving member 12a by the support members 21, there is an increase of frictional force acted on between the piezoelectric element 10 and the moving member 12a. Accordingly, the drive force caused on the piezoelectric element 20 is conveyed to the moving member 12a with higher efficiency.

Also, the provision of the constriction decreases a vibration transmission area, further decreasing the loss of vibration through the support member 21. Accordingly, the ultrasonic motor 2 transmits a drive force to the moving member 12a with higher efficiency.

Incidentally, the method of providing elasticity to the support member 21 includes a method of forming a support member 21 of a conductive rubber with the shape of the support member 11 used as it is.

Also, the support member 21 may be provided with an entire or part of an electric circuit such as a self-oscillation transmitting circuit.

FIG. 5 is a view showing a schematic structure of elements of a second embodiment of the inventive ultrasonic motor 3.

The ultrasonic motor 3 is made having a structure with the piezoelectric element 30 is mounted on a substrate B having a recess by support members 8b, 8b that are provided as portions of the substrate B in the recess. Also, as shown in FIG. 5(b), the piezoelectric member 30 has a top surface substantially in a same plane as that of a top surface of the substrate 8. Incidentally, not-shown structural constituents that are not shown are substantially the same as those of the ultrasonic motor 1.

Figure 5A:
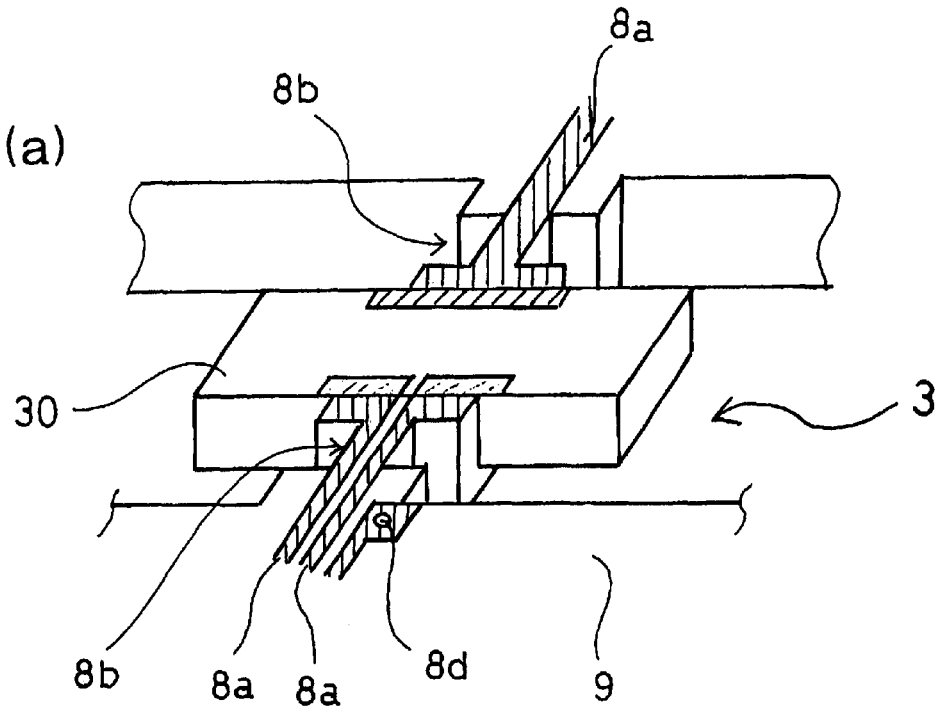
FIG. 5 is a view showing an structure of a ultrasonic motor according to a second embodiment of the present invention.
Figure 5B:
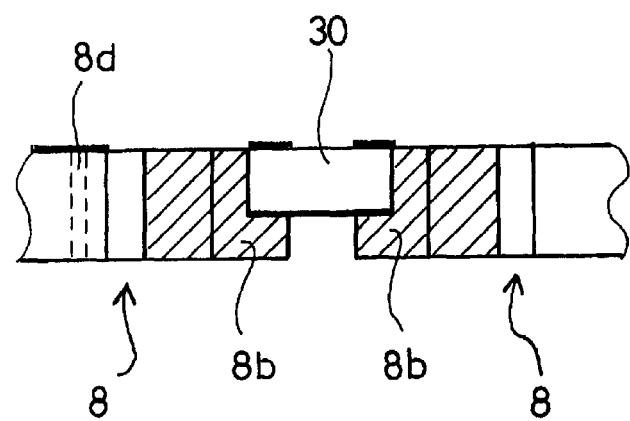

The support member 8b is structured, as shown in FIG. 5(a), to have a support portion for holding the piezoelectric element 30 at a tip end of a terminal extended from the substrate 8. Due to this, the support member 8b is generally in a T-form in section in a parallel direction with the substrate 8. This substrate 8 is formed having a predetermined form, for example, by preparing a forming mold for the substrate 8 in a corresponding shape to T-Form shape described above. Also, as shown in FIG. 5(b), the support portion is formed as a convex portion to support an underside of the piezoelectric element 30. One support member 8b has at a top face single lines 8a to be connected to a part of the electrodes of the piezoelectric element 30, while the other support member 8b has at a top face a signal line 8a, 81 to be connected to the remainder of the electrodes of the piezoelectric element 30. Incidentally, the number of the signal lines 8a or support members 8b or their forming positions may be appropriately changed in accordance with the number of electrodes on the piezoelectric element 30 or a vibrational node position.

Here, the support member 8b is provided so that it holds a flex vibration node on the piezoelectric element 30, similarly to the support member 11.

The piezoelectric element 30 has almost the same structure as that of the piezoelectric element 10 except for a structure of extending electrodes to end faces 30a, 30b.

Here, when required, a signal line is passed through a hole 8d opened in the substrate 82 so that the signal line is connected to an electrode provided on a backside of the piezoelectric element 30.

That is, if a drive signal X is inputted through signal lines 8a, 8a, 8a to the electrodes of the piezoelectric element 30, the piezoelectric element 30 at the end face effects elliptic vibration to thereby move the moving member (not shown) that is in contact with the end face.

As described above, because in the ultrasonic motor 3 the support members 8b, 8b serve also as a signal transmitting means alike in the ultrasonic motor 1, the loss of the expanding-and-contracting vibration and flex vibration occurring on the piezoelectric element 30 is reduced as compared to the conventional ultrasonic motor. Further, because the support members 8b are provided in a manner holding a flex vibration node, the loss of the flex vibration caused on the piezoelectric element is further reduced.

Accordingly, the ultrasonic motor 3 can efficiently transmit the drive force caused in the piezoelectric element 30 to the moving member.

Also, because the piezoelectric element 30 is provided in the recess of the substrate 8 such that the piezoelectric element 30 to the moving member.

Also, because the piezoelectric element 30 is provided in the recess of the substrate 8 such that the piezoelectric element 30 and the substrate 8 at their top surfaces are in a same plane, the total thickness of the ultrasonic motor 3 and the substrate 8 are decreased, making the size small. Consequently, the application range of the ultrasonic motor.

Incidentally, the support member 8b may be formed with a constriction in a manner similarly to the support member 21, or the support member 8b may be formed of conductive rubber. In this case, because the piezoelectric element 30 is pressed against the moving member by the support member 8b, a further increase in the transmission efficiency of drive force to the moving member is obtained.

Furthermore, the support member 8b may be provided with an entire or part of an electric circuit such as a self-oscillation generating circuit. In this case, the number of elements on the substrate is decreased to reducing the required substrate area. Accordingly, the ultrasonic motor 3 is made further smaller in size.

The present embodiment may be further modified as follows.

FIG. 6 is a view showing a schematic structure of essential elements of a ultrasonic motor 4 of a first modification according to the present embodiment. Incidentally, the structural constituents not shown are substantially the same structure as those of the ultrasonic motor 1.

Figure 6A:
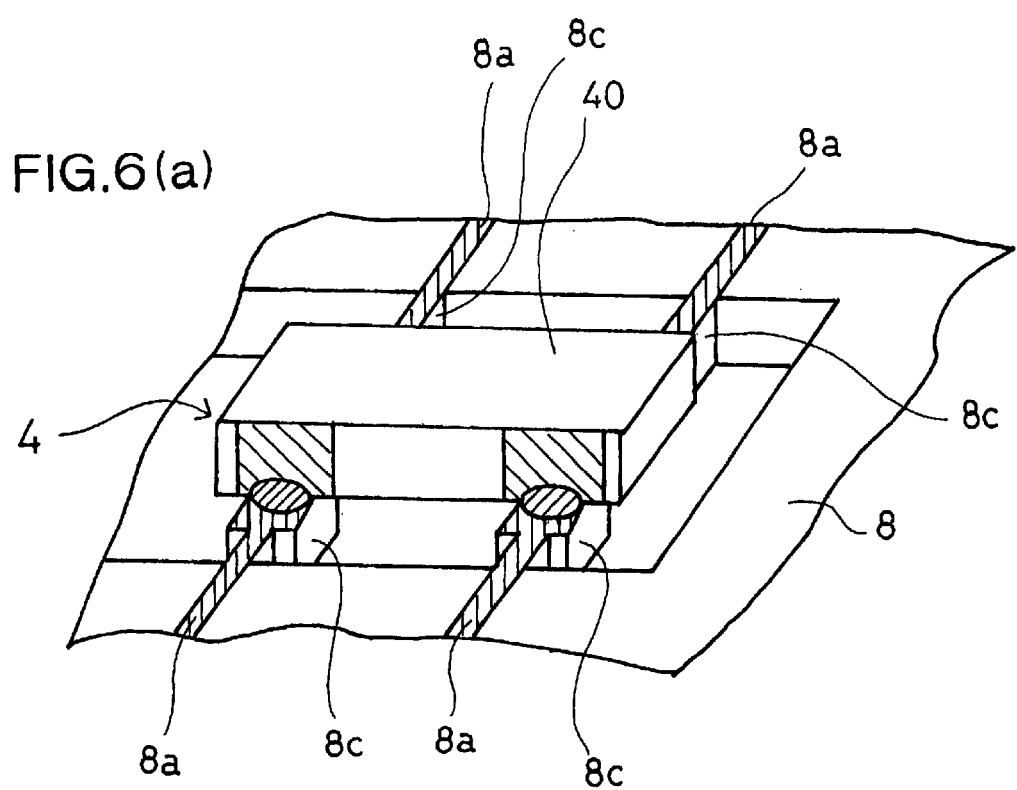
FIG. 6 is a view showing structurally essential elements of a modification to the ultrasonic motor shown in FIG. 5.
Figure 6B:
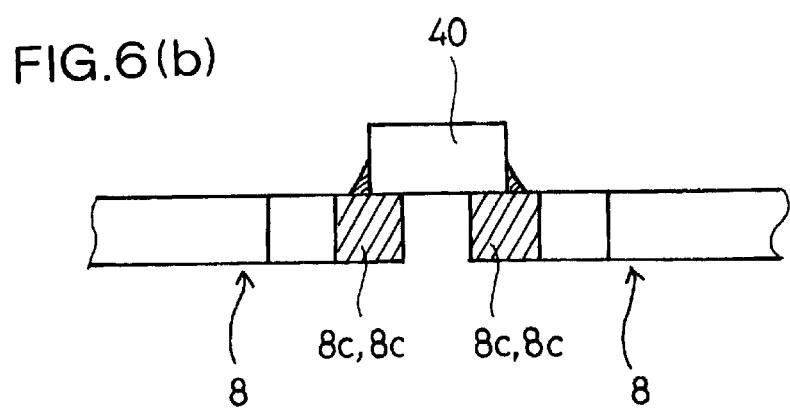

In FIG. 6, the ultrasonic motor 4 is structured such that the piezoelectric element 40 is fixed, corresponding to nodes of flex vibration of the piezoelectric element 40, on surfaces o the support members 8c, 8c . . . provided in a recess of a substrate 8 using, for example, solder, as shown in FIG. 6(b).

The support member 8c is structured having a piezoelectric element 40 support portion provided at a tip of an extension terminal extended form the substrate 8, as shown in FIG. 6(a). The support portion has a top face that is flush with the top face of the substrate 8. Due to this, the sectional shape in a parallel direction to the substrate 8 is generally a T form.

Also, a predetermined signal line 8a is provided on a surface of the support member 8c corresponding to an electrode of the piezoelectric element 40. Incidentally, the number of single lines 8a, and the number and position of support members 8c are appropriately changed depending on the number of electrodes of the piezoelectric element 40 or the position of vibration node.

The piezoelectric element 40 is structured generally the same a the piezoelectric element 10 except for an electrode extended to an end face.

As described above, in accordance with the inventive ultrasonic motor 4 the loss of the expansion-and-contraction and flex vibration caused on the piezoelectric element 40 is reduced as compared to the conventional ultrasonic motor 1. Furthermore, because the support member 8c is provided in a manner holding a flex vibration node of the piezoelectric element 40, the amount of loss of the flex vibration caused in the piezoelectric element 40 is further reduced.

Accordingly, the ultrasonic motor 4 efficiently delivers a drive force produced on the piezoelectric element 40 to the moving member.

Also, the piezoelectric element 40 is mounted through solder on the surfaces of the support members 8c. accordingly, where for example the circuit board 8 is formed by a printed board, it is possible to mount the piezoelectric element 40 on the circuit board 8 in a similar procedure to conventional mounting of a transistor or capacitor on the board. That is, the ultrasonic motor 4 allows on-board mounting using an existing electric circuit production line, reducing mounting cost and improving reliability.

Incidentally, the support member 8c may be provided with a constriction similarly to the support member 21 or the support member 8c only may be formed of a conductive rubber. In this case, because the piezoelectric element 40 is pushed against the moving member by the support member 8c, the transmission efficiency of drive force to the moving member further improves.

Also, the support member 8c may be provided with an entire or one part of an electric circuit, such as a self-oscillation circuit.

FIG. 7 is a block diagram illustrating an electronic appliance incorporating an embodiment of the inventive ultrasonic motor 5.

An electronic appliance with an ultrasonic motor 5 is realized by providing a piezoelectric element 51 treated by a predetermined polarization process, a vibration member 52 joined to an piezoelectric element 51, a moving member 53 to be moved by the vibration member 52, a pressurizing mechanism 54 for applying pressure to the vibration member 52 and moving member 53, a transmission mechanism 55 movable interlinked to the moving member 53, and an output mechanism 56 to be moved based on operation of the transmission mechanism 55. Incidentally, the pressurizing mechanism 54 is, for example, provided by the support member 21.

Here, the electronic appliance incorporating an embodiment of the inventive ultrasonic motor 5 includes, for example, electronic timepieces, measuring instruments, cameras, printers, printing machines, machine tools, robots, moving apparatuses, memory devices and so on.

Also, the piezoelectric vibrator 51 uses, for example, piezoelectric elements 10, 20, 30. Also, the transmission mechanism 55 uses, for example, a transmission wheel, such as a gear, friction wheel, or the like. The output mechanism 56 uses, for example for a camera, a shutter drive mechanism or lens drive mechanism, and for an electronic timepiece, a pointer drive mechanism or calendar drive mechanism. Where used in a memory device, a head drive mechanism for driving a head to read and write information from and to a memory medium within the information memory device. For a machine tool, a tool feed mechanism or work feed mechanism is used.

The electronic appliance incorporates an ultrasonic motor 5 construed according to the present invention having a higher output as compared to the conventional ultrasonic motor, and thus the ultrasonic motor and its drive circuits are reduced in size. Accordingly, the electronic appliance is smaller in size as compared to a similar. conventional electronic appliance. Also, where a self-oscillation drive is employed as a method to drive the ultrasonic motor, it is possible to further reduce the size for the electronic appliance incorporating an inventive ultrasonic motor 5.

Further, if an output axis is provided to the moving member 53 to make a structure having a power transmission mechanism for transmitting torque through the output axis, a drive mechanism is a single ultrasonic motor.

According to this invention, because the drive signal is transmitted through the support member to the piezoelectric vibrator, there is no need to separately provide a signal transmission part. Accordingly, the loss of the expansion-and-contraction vibration and flex vibration caused on the piezoelectric vibrator is reduced as compared to the conventional ultrasonic motor. Therefore, the ultrasonic motor according to the present invention efficiently transmit a drive force caused on the piezoelectric vibrator to the moving member.

Also, in accordance with the present invention the necessity of separately providing a signal transmission part is avoided and thus reducing the size of the inventive ultrasonic motor and decreasing the number of manufacture processes resulting in a reduction in manufacturing cost.

In accordance with the present invention, the piezoelectric vibrator is urged on the moving member by the elasticity of the support member. Accordingly, the drive force caused on the piezoelectric vibrator is transmitted to the moving member with higher efficiency.

Further, according to this invention, the provision of the constriction in the support member reduces the vibration transmission area and reduces vibration loss. Consequently, the ultrasonic motor transmits a drive force to the moving member with higher efficiency. Furthermore, the support member has elasticity due to the constriction, and has an operation equivalent to that of the above invention.

Further, in accordance with the present invention, because the support member is part of the substrate, the ultrasonic motor is easy to mount on the substrate.

In addition, in accordance with the present invention there is a decrease in the thickness of the ultrasonic motor plus the substrate a compared with the conventional art. Accordingly the application of the inventive ultrasonic motor is broadened as compared to the conventional ultrasonic motor.

In addition, because the piezoelectric vibrator is mounted on the support member, the piezoelectric vibrator can be mounted on a substrate in a similar procedure to conventional mounting of transistors or capacitors on a substrate. That is, in accordance with the ultrasonic motor of the present invention, it is possible to simultaneously mount a motor and circuits on a substrate by using an existing electric circuit production line. Accordingly, the inventive ultrasonic motor lower mounting cost and a more stabilized mounting process.

Further, according to this invention, because the support member is provided with at least part of a drive circuit, there is a reduction in the variation in ultrasonic motor performance resulting from mounting of the piezoelectric vibrator and the drive circuit, improving the reliability.

Further, according to his invention, because the support member holds the piezoelectric vibrator at a point corresponding to a node of flex vibration, there is further a decrease in externally lost vibration caused on the piezoelectric vibrator. Consequently, the ultrasonic motor can transmit a drive force caused on the piezoelectric vibrator to the moving member with higher efficiency.

Further, according to this invention, because the aforesaid ultrasonic motor is used in which less vibration is lost as compared to the conventional ultrasonic motor, the ultrasonic motor is increased in output. That is, the ultrasonic motor and its drive circuit are reduced in size, hence the electronic appliance with ultrasonic motor is decreased in size.

What is claimed is:

1. An ultrasonic motor, comprising: a movable member disposed to undergo movement in response to a drive force; a substrate having a conductor pattern for conveying a drive signal from a drive circuit; a piezoelectric vibrator for undergoing oscillating movement in in response to the drive signal so as to contact the movable member and generate the drive force to drive the movable member; and a pair of support members provided on the substrate and disposed on opposite sides of the piezoelectric vibrator for mechanically fixedly supporting the piezoelectric vibrator only in a region thereof corresponding to a node of vibration of the piezoelectric vibrator, the support members having an L-shaped form, one leg of each support member being fixedly attached to the substrate, and another leg of each support member being fixedly attached to the piezoelectric element; wherein transmission of the drive signal form the conductor pattern to electrodes of the piezoelectric vibrator is effected only by the support member so that no conductor wires extend from the substrate to connect the drive circuit and the piezoelectric vibrator.

2. An ultrasonic motor according to claim 1; wherein the one leg of the support members is soldered to the substrate and the other leg is adhered to the piezoelectric element by conductive paste.

3. An ultrasonic motor, comprising: a movable member disposed to undergo movement in response to a drive force; and substrate having a conductor pattern for conveying a drive signal from a drive circuit; a piezoelectric vibrator for undergoing oscillating movement in response to the drive signal so as to contact the movable member and generate the drive force to drive the movable member; and a pair of support members provided on the substrate and disposed on opposite sides of the piezoelectric vibrator for mechanically fixedly supporting the piezoelectric vibrator only in a region thereof corresponding to a node of vibration of the piezoelectric vibrator, the support members each having an I-shaped form with upper and lower portions having a larger width than a middle portion, the lower portion of each support member being fixedly attached to the substrate, and the upper portion of each support member being fixedly attached to the piezoelectric element; wherein transmission of the drive signal from the conductor pattern to electrodes of the piezoelectric vibrator is effected only by the support member so that no conductor wires extend from the substrate to connect the drive circuit and the piezoelectric vibrator.

4. An ultrasonic motor according to claim 3; wherein the middle portion of each support member is flexible so that the piezoelectric vibrator is resiliently biased in contact with the movable member.

5. An ultrasonic motor, comprising: a movable member disposed to undergo movement in response to a drive force; a substrate having a conductor pattern for conveying a drive signal from a drive circuit; a piezoelectric vibrator provided on the substrate for undergoing oscillating movement in response to the drive signal so as to contact the movable member and generate the drive force to drive the movable member; and a support member provided on the substrate for mechanically supporting the piezoelectric vibrator on the substrate and transmitting the drive signal from the conductor pattern to electrodes of the piezoelectric vibrator so that no conductor wires extend from the substrate to connect the drive circuit and the piezoelectric vibrator, the support member having a constriction portion that is thinner than a connection portion connected to the piezoelectric vibrator.

6. An ultrasonic motor, comprising: a movable member disposed to undergo movement in response to a drive force; a substrate having a conductor pattern for conveying a drive signal from a drive circuit; a piezoelectric vibrator provided in a recess provided on the substrate for receiving the piezoelectric vibrator, the piezoelectric vibrator for undergoing oscillating movement in response to the drive signal so as to contact the movable member and generate the drive force to drive the movable member; and a support member provided on the substrate for mechanically supporting the piezoelectric vibrator on the substrate and transmitting the dirve signal from the conductor pattern to electrodes of the piezoelectric vibrator so that no conductor wires extend from the substrate to connect the drive circuit and the piezoelectric vibrator; wherein the substrate has a recess portion for receiving the piezoelectric vibrator.

7. An ultrasonic motor, comprising: a substrate; a piezoelectric vibrator disposed on the substrate to undergo vibration in response to a drive signal; a support member for supporting the piezoelectric vibrator on the substrate, the support member being effective to transmit the drive signal to the piezoelectric vibrator and the support member having a relatively thinner constriction portion and a relatively thicker connection portion, the constriction portion being effective for decreasing vibration losses; and a movable member disposed on the substrate adjacent the piezoelectric vibrator and driven in response to vibration of the piezoelectric vibrator; wherein the piezoelectric vibrator comprises one or more piezoelectric elements polarized to undergo expansion-and- contraction vibration in response to the drive signal and laminated to one or more piezoelectric elements polarized to undergo flexural vibration in response to the drive signal, and the piezoelectric vibrator is disposed so that a side face thereof is in contact with the movable member and undergoes elliptical movement in response to the drive signal to drive the movable member.

8. An ultrasonic motor, comprising: a substrate; a piezoelectric vibrator disposed on the substrate to undergo vibration in response to a drive signal; a support member for supporting the piezoelectric vibrator on the substrate, the support member being effective to transmit the drive signal to the piezoelectric vibrator; and a movable member disposed on the substrate adjacent the piezoelectric vibrator and driven in response to vibration of the piezoelectric vibrator; wherein the piezoelectric vibrator comprises one or more piezoelectric elements polarized to undergo expansion-and-contraction vibration in response to the drive signal and laminated to one or more piezoelectric elements polarized to undergo flexural vibration in response to the drive signal, and the piezoelectric vibrator is disposed so that a side face thereof is in contact with the movable member and undergoes elliptical movement in response to the drive signal to drive the movable member; wherein the support member comprises part of the substrate; and wherein the substrate has a recess portion in which is disposed the piezoelectric vibrator.

9. An ultrasonic motor, comprising: a substrate; a piezoelectric vibrator disposed on the substrate to undergo vibration in response to a drive signal; a support member comprised of two support member pieces disposed on opposite sides of the piezoelectric vibrator for supporting the piezoelectric vibrator on the substrate, the support member pieces being effective to transmit the drive signal to the piezoelectric vibrator; and a movable member disposed on the substrate adjacent the piezoelectric vibrator and driven in response to vibration of the piezoelectric vibrator; wherein the piezoelectric vibrator comprises one or more piezoelectric elements polarized to undergo expansion-and-contraction vibration in response to the drive signal and laminated to one or more piezoelectric elements polarized to undergo flexural vibration in response to the drive signal, and the piezoelectric vibrator is disposed so that a side face thereof is in contact with the movable member and undergoes elliptical movement in response to the drive signal to drive the movable member.

10. An ultransonic motor according to claim 9; wherein of the support member pieces has a set of signal lines fixed thereto for transmitting the drive signal to the piezoelectric vibrator.

11. An ultrasonic motor, comprising: a substrate; a piezoelectric vibrator disposed on the substrate to undergo vibration in response to a drive signal; a pair of support members disposed on opposite sides of the piezoelectric vibrator for supporting the piezoelectric vibrator on the substrate, the support members being effective to transmit the drive signal to the piezoelectric vibrator; and a movable member disposed on the substrate adjacent the piezoelectric vibrator and driven in response to vibration of the piezoelectric vibrator; wherein the piezoelectric vibrator comprises one or more piezoelectric elements polarized to undergo expansion-and-contraction vibration in response to the drive signal and laminated to one or more piezoelectric elements polarized to undergo flexural vibration in response to the drive signal, and the piezoelectric vibrator is disposed so that a side face thereof is in contact with the movable member and undergoes elliptical movement in response to the drive signal to drive the movable member.

12. An ultrasonic motor according to claim 11; wherein the support members have an L-shaped form, one leg of each support member is fixedly attached to the substrate, and another leg of each support member is fixedly attached to the piezoelectric elements.

13. An ultrasonic motor according to claim 12; wherein the one leg of the support members is soldered to the substrate and the other leg is adhered to the piezoelectric element by conductive paste.

14. An ultrasonic motor according to claim 11; wherein the support members each have an I-shaped form with upper and lower portions having a larger width than a middle portion, the lower portion of each support member is fixedly attached to the substrate, and the upper portion of each support member is fixedly attached to the piezoelectric element.

15. An ultrasonic motor according to claim 14; wherein the middle portion of each support member is flexible so that the piezoelectric vibrator is resiliently biased in contact with the movable member.

* * * * *